United States Patent
Okuno

(10) Patent No.: US 9,406,514 B2
(45) Date of Patent: Aug. 2, 2016

(54) GROUP III NITRIDE SEMICONDUCTOR LIGHT-EMITTING DEVICE AND PRODUCTION METHOD THEREFOR

(71) Applicant: TOYODA GOSEI CO., LTD., Kiyosu-shi (JP)

(72) Inventor: Koji Okuno, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 14/800,035

(22) Filed: Jul. 15, 2015

(65) Prior Publication Data
US 2016/0020361 A1    Jan. 21, 2016

(30) Foreign Application Priority Data

Jul. 18, 2014 (JP) ................................ 2014-147841

(51) Int. Cl.
*H01L 21/205* (2006.01)
*H01L 33/32* (2010.01)
*H01L 33/00* (2010.01)

(52) U.S. Cl.
CPC ........ *H01L 21/2056* (2013.01); *H01L 33/0075* (2013.01); *H01L 33/325* (2013.01)

(58) Field of Classification Search
CPC ............ H01L 21/2056; H01L 33/0075; H01L 33/325
See application file for complete search history.

(56) References Cited

U.S. PATENT DOCUMENTS

| 6,165,812 | A * | 12/2000 | Ishibashi | C30B 25/02 117/89 |
| 2007/0290230 | A1* | 12/2007 | Kawaguchi | B82Y 20/00 257/196 |
| 2010/0289042 | A1* | 11/2010 | Tamura | H01L 33/14 257/94 |
| 2011/0175057 | A1* | 7/2011 | Tamura | H01L 33/30 257/13 |
| 2011/0207299 | A1* | 8/2011 | Sakurai | C23C 16/4401 438/478 |
| 2012/0112188 | A1* | 5/2012 | Yokoyama | H01L 21/0242 257/51 |
| 2012/0146191 | A1* | 6/2012 | Yasuhara | C23C 16/303 257/615 |

FOREIGN PATENT DOCUMENTS

| JP | H 08-097471 A | 4/1996 |
| JP | 2003-264154 A | 9/2003 |
| JP | 3443379 B2 | 9/2003 |
| JP | 3453558 B2 | 10/2003 |
| JP | 3862671 B2 | 12/2006 |

* cited by examiner

*Primary Examiner* — Allan R Wilson
(74) *Attorney, Agent, or Firm* — McGinn IP Law Group, PLLC

(57) ABSTRACT

The present invention provides a Group III nitride semiconductor light-emitting device having a low drive voltage and a production method therefor. A p-type semiconductor layer formation step comprises a p-type cladding layer formation step of forming a p-side superlattice layer on a light-emitting layer by supplying a first raw material gas containing at least a Group III element and a dopant gas, a p-type intermediate layer formation step of forming a p-type intermediate layer on the p-side superlattice layer by supplying a first raw material gas and a dopant gas, a dopant gas supply step of supplying the dopant gas while stopping the supply of the first raw material gas after the p-type intermediate layer formation step, and a p-type contact layer formation step of forming a p-type contact layer on the p-type intermediate layer by supplying a first raw material gas and a dopant gas after the dopant gas supply step.

15 Claims, 7 Drawing Sheets

GROUP III NITRIDE SEMICONDUCTOR LIGHT-EMITTING DEVICE AND PRODUCTION METHOD THEREFOR

BACKGROUND OF THE INVENTION

1. Field of the Invention

The technical field of the present specification relates to a Group III nitride semiconductor light-emitting device and a production method therefor. More specifically, it relates to a Group III nitride semiconductor light-emitting device having a low drive voltage, and a production method therefor.

2. Background Art

For the Group III nitride semiconductor light-emitting device, there is no electrode material having a work function that can achieve complete ohmic contact with a p-type contact layer, e.g., a p-type GaN layer. Therefore, a Schottky Contact is formed between the p-type contact layer and the p-electrode. To reduce the contact resistance, preferably, carriers easily tunnel through the Schottky barrier by the tunnel effect. For example, the Schottky barrier is thinned by doping a p-type dopant to the p-type contact layer at a high concentration. Furthermore, to make the carriers easier to tunnel through the Schottky barrier, there are preferably some crystal defects in the Schottky barrier because the carriers easily tunnel through the Schottky barrier by a hopping conduction via the crystal defects.

Japanese Patent Application Laid-Open (kokai) No. 08-097471 discloses a light-emitting diode 10 comprising a second contact layer 62, and a first contact layer 63 having a Mg concentration higher than that of the second contact layer 62 (refer to paragraph [0011] and FIG. 1). Thus, a light-emitting diode having a low drive voltage was obtained (refer to paragraph [0009]).

To make the carriers easily tunnel through the Schottky barrier by the tunnel effect, the concentration of the p-type dopant, for example, Mg, that is doped to the p-type contact layer is increased. For that purpose, a high-concentration p-type dopant must be incorporated in the semiconductor crystal by increasing the concentration of the p-type dopant gas.

However, right after the supply of the p-type dopant gas was started or when the supply amount of the p-type dopant gas was quickly increased, the dopant concentration of the growing p-type contact layer is lower than a desired dopant concentration. The dopant concentration of the p-type contact layer tends to increase as the thickness increases, that is, the growth time passes. This achieves the desired dopant concentration near the contact surface of the p-type contact layer.

Since the dopant gas or particles generated from the gas adsorbs on the inner wall of the chamber by the memory effect, the gas concentration is considered to be unstable right after the supply of the p-type dopant gas was started or increased in a step function. Therefore, the desired gas concentration is not achieved on the crystal growth surface. Or, a high dopant concentration is not achieved in a thin contact layer due to a characteristic that the p-type dopant is difficult to be incorporated in the Group III nitride semiconductor. To achieve the desired concentration of the p-type dopant (impurity) in the semiconductor, the p-type contact layer must have a thickness larger than the thickness of the Schottky barrier. The electric resistivity is increased due to increase of excessive series resistance component or occurrence of unintentional crystal defect, thereby increasing the drive voltage. Thus, to produce a semiconductor light-emitting device having a low electric resistivity, it is important to provide a p-type contact layer having a small thickness and a high p-type dopant concentration.

SUMMARY OF THE INVENTION

The present techniques have been conceived in order to solve the aforementioned technical problems involved in the conventional techniques. Thus, an object of the present techniques is to provide a Group III nitride semiconductor light-emitting device having a low drive voltage. Another object is to provide a method for producing the light-emitting device.

In a first aspect of the present invention, there is provided a method for producing a Group III nitride semiconductor light-emitting device, the method comprising the following:

an n-type semiconductor layer formation step of forming an n-type semiconductor layer;

a light-emitting layer formation step of forming a light-emitting layer on the n-type semiconductor layer; and a p-type semiconductor layer formation step of forming a p-type semiconductor layer on the light-emitting layer. The p-type semiconductor layer formation step comprises the following:

a p-type cladding layer formation step of forming a p-type cladding layer on the light-emitting layer by supplying a first raw material gas containing at least a Group III element and a dopant gas;

a p-type intermediate layer formation step of forming a p-type intermediate layer on the p-type cladding layer by supplying the first raw material gas and the dopant gas in a first period;

a dopant gas supply step of supplying the dopant gas in a second period while stopping the supply of the first raw material gas or reducing the supply amount of the first raw material gas so that the Group III nitride semiconductor is not grown after forming the p-type intermediate layer; and a p-type contact layer formation step of forming a p-type contact layer on the p-type intermediate layer by supplying the first raw material gas and the dopant gas in a third period after the dopant gas supply step in the second period.

In the method for producing a Group III nitride semiconductor light-emitting device, the concentration of dopant gas is increased inside a chamber of a semiconductor producing device and near the surface of a semiconductor crystal before the formation of the p-type contact layer. That is, just before the formation of the p-type contact layer, the vicinity of a growth substrate is sufficiently and stably filled with a dopant gas. Therefore, Mg is easy to be quickly incorporated from right after the growth start of the p-type contact layer. The p-type contact layer having a small thickness and a high Mg concentration can be achieved. A Schottky barrier through which carriers easily transmit due to the tunneling effect, can be formed. Accordingly, a Group III nitride semiconductor light-emitting device having a low drive voltage can be produced.

A second aspect of the present invention is drawn to a specific embodiment of the method for producing a Group III nitride semiconductor light-emitting device according to the first aspect of the invention, wherein the molar ratio of the dopant gas to the first raw material gas in the dopant gas supply step in the second period is higher than the molar ratio of the dopant gas to the first raw material gas in the p-type intermediate layer formation step.

A third aspect of the present invention is drawn to a specific embodiment of the method for producing a Group III nitride semiconductor light-emitting device according to the first or second aspect of the invention, wherein the molar ratio of the dopant gas to the first raw material gas in the p-type contact layer formation step is higher than the molar ratio of the dopant gas to the first raw material gas in the p-type intermediate layer formation step.

A fourth aspect of the present invention is drawn to a specific embodiment of the method for producing a Group III nitride semiconductor light-emitting device according to any one of the first to third aspect of the invention, wherein the flow rate of the dopant gas in the dopant gas supply step in the second period is higher than the flow rate of the dopant gas in the p-type intermediate layer formation step. Moreover, the flow rate of the dopant gas in the p-type contact layer formation step is higher than the flow rate of the dopant gas in the p-type intermediate layer formation step.

A fifth aspect of the present invention is drawn to a specific embodiment of the method for producing a Group III nitride semiconductor light-emitting device according to any one of the first to third aspect of the invention, wherein the flow rate of the dopant gas in the dopant gas supply step in the second period is lower than the flow rate of the dopant gas in the p-type contact layer formation step. Moreover, the flow rate of the dopant gas in the p-type contact layer formation step, is higher than the flow rate of the dopant gas in the p-type intermediate layer formation step.

A sixth aspect of the present invention is drawn to a specific embodiment of the method for producing a Group III nitride semiconductor light-emitting device according to any one of the first to third aspect of the invention, wherein the flow rate of the dopant gas in the dopant gas supply step in the second period is higher than the flow rate of the dopant gas in the p-type contact layer formation step. Moreover, the flow rate of the dopant gas in the p-type contact layer formation step is higher than the flow rate of the dopant gas in the p-type intermediate layer formation step.

A seventh aspect of the present invention is drawn to a specific embodiment of the method for producing a Group III nitride semiconductor light-emitting device according to any one of the first to sixth aspect of the invention, wherein the supply amount of dopant gas is gradually increased in the dopant gas supply step in the second period.

An eighth aspect of the present invention is drawn to a specific embodiment of the method for producing a Group III nitride semiconductor light-emitting device according to any one of the first to seventh aspect of the invention, wherein the supply amount of first raw material gas in the p-type contact layer formation step is equal to the supply amount of the first raw material gas in the p-type intermediate layer formation step.

A ninth aspect of the present invention is drawn to a specific embodiment of the method for producing a Group III nitride semiconductor light-emitting device according to any one of the first to eighth aspect of the invention, wherein the third raw material gas containing nitrogen atom is supplied in the p-type intermediate layer formation step and the p-type contact layer formation step, and the supply of the third raw material gas is stopped in the dopant gas supply step in the second period.

A tenth aspect of the present invention is drawn to a specific embodiment of the method for producing a Group III nitride semiconductor light-emitting device according to any one of the first to ninth aspect of the invention, wherein the p-type intermediate layer formation step comprises the steps of forming a first p-type intermediate layer on the p-type cladding layer, and forming a second p-type intermediate layer on the first p-type intermediate layer.

An eleventh aspect of the present invention is drawn to a specific embodiment of the method for producing a Group III nitride semiconductor light-emitting device according to any one of the first to tenth aspect of the invention, wherein the dopant gas supply step in the second period is performed within a range of 1 second to 60 seconds.

A twelfth aspect of the present invention is drawn to a specific embodiment of the method for producing a Group III nitride semiconductor light-emitting device according to any one of the first to eleventh aspect of the invention, wherein the first raw material gas is a gas containing a gallium atom as a Group III element. Moreover, the dopant gas is a gas containing a magnesium atom. The gas containing a gallium atom includes trimethylgallium (TMG) or triethylgallium (TEG). The gas containing magnesium atom includes bis(cyclopentadienyl)magnesium $(Mg(C_5H_5)_2)$ or bis(ethylcyclopentadienyl)magnesium $(EtCp_2Mg:Mg(C_2H_5C_5H_4)_2)$.

A thirteenth aspect of the present invention is drawn to a specific embodiment of the method for producing a Group III nitride semiconductor light-emitting device according to any one of the first to twelfth aspect of the invention, wherein at least nitrogen gas is supplied as a carrier gas in the p-type intermediate layer formation step. The molar ratio of nitrogen atom in the carrier gas is within a range of 30% to 80%.

A fourteenth aspect of the present invention is drawn to a specific embodiment of the method for producing a Group III nitride semiconductor light-emitting device according to any one of the first to sixth aspect of the invention, wherein the flow rate of the dopant gas is increased in a step function near the start of the second period.

A fifteenth aspect of the present invention is drawn to a specific embodiment of the method for producing a Group III nitride semiconductor light-emitting device according to the fourteenth aspect of the invention, wherein the flow rate of the dopant gas increased in a step function is maintained in the second and third periods.

In a sixteenth aspect of the present invention, there is provided a Group III nitride semiconductor light-emitting device comprising an n-type semiconductor layer, a light-emitting layer on the n-type semiconductor layer, a p-type semiconductor layer on the light-emitting layer, and a p-electrode on the p-type semiconductor layer. The p-type semiconductor layer comprises a p-type contact layer in contact with the p-electrode and a p-type intermediate layer in contact with the p-type contact layer. The p-type contact layer has a thickness of 0.5 nm to 50 nm. A Mg concentration change rate X from a contact surface of the p-type intermediate layer to a contact surface of the p-electrode in the p-type contact layer is within a range of $5\times10^{18} \leq X \leq 1\times10^{20}$, X:Mg concentration change rate $(cm^{-3} \cdot nm^{-1})$.

The present specification provides a Group III nitride semiconductor light-emitting device having a low drive voltage and a production method therefor.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENT

Figure 1:
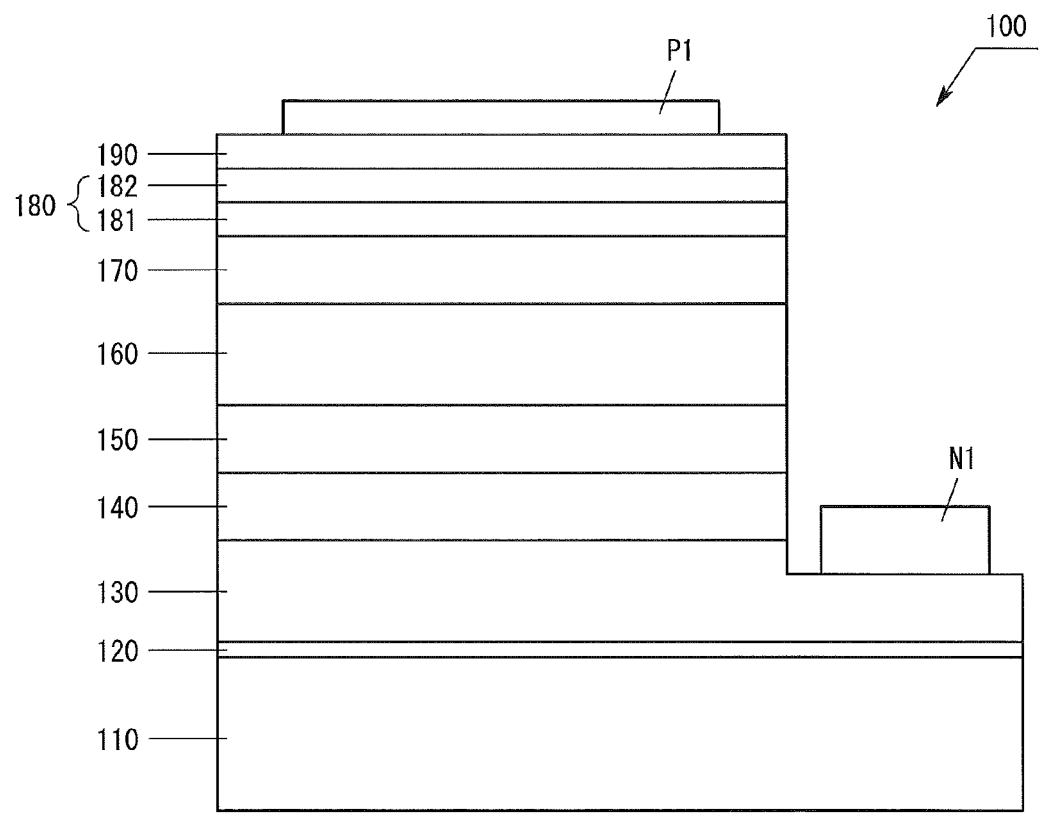
FIG. 1 is a schematic view of the structure of a light-emitting device according to an embodiment.

Specific embodiment of the present invention will next be described with reference to the drawings by taking, as an example, a semiconductor light-emitting device and a production method therefor. However, the present invention is not limited to this embodiment. In the below-described semiconductor light-emitting device, the layered structure of each layer or the structure of each electrode are shown for an exemplary purpose. Needless to say, the layered structure may differ from that described below in the embodiment. The thickness of each layer which is schematically shown in the drawings does not correspond to its actual value.

Embodiment 1

1. Semiconductor Light-Emitting Device

FIG. 1 is a schematic view of the structure of a light-emitting device 100 according to embodiment 1. The light-emitting device 100 is a face-up type semiconductor light-emitting device. The light-emitting device 100 has a plurality of semiconductor layers formed of a Group III nitride semiconductor. As shown in FIG. 1, the light-emitting device 100 has a substrate 110, a buffer layer 120, an n-type contact layer 130, an n-side ESD layer 140, an n-side superlattice layer 150, a light-emitting layer 160, a p-side superlattice layer 170, a p-type intermediate layer 180, a p-type contact layer 190, a p-electrode P1, and an n-electrode N1.

On the main surface of the substrate 110, the buffer layer 120, the n-type contact layer 130, the n-side ESD layer 140, the n-side superlattice layer 150, the light-emitting layer 160, the p-side superlattice layer 170, the p-type intermediate layer 180, and the p-type contact layer 190 are successively formed in this order. The n-electrode N1 is formed on the n-type contact layer 130. The p-electrode P1 is formed on the p-type contact layer 190. Each of the n-type contact layer 130, the n-side ESD layer 140, and the n-side superlattice layer 150 is an n-type semiconductor layer. Each of the p-side superlattice layer 170, the p-type intermediate layer 180, and the p-type contact layer 190 is a p-type semiconductor layer. In some cases, any of these layers may partially include a non-doped layer. Thus, the light-emitting device 100 includes an n-type semiconductor layer, a light-emitting layer disposed on the n-type semiconductor layer, the p-type semiconductor layer disposed on the light-emitting layer, a p-electrode P1 disposed on the p-type semiconductor layer, and an n-electrode N1 disposed on the n-type semiconductor layer.

The substrate 110 is a growth substrate. On the main surface of the substrate 110, the aforementioned semiconductor layers are formed through MOCVD. The main surface of the substrate 110 is preferably roughened. The substrate 110 is made of sapphire. Other than sapphire, materials such as SiC, ZnO, Si, GaN, and AlN may be employed.

The buffer layer 120 is formed on the main surface of the substrate 110. The buffer layer 120 is provided so as to form high-density crystal nuclei on the substrate 110. By virtue of the buffer layer 120, growth of a semiconductor crystal having a flat surface is promoted. Examples of the material of the buffer layer 120 include AlN, GaN, BN, and TiN.

The n-type contact layer 130 is in contact with the n-electrode N1. The n-type contact layer 130 is formed on the buffer layer 120. The n-type contact layer 130 is an n-type GaN layer. The n-type contact layer 130 has a Si concentration of $1 \times 10^{18}/cm^3$ or more. The n-type contact layer 130 may be formed of a plurality of layers having different carrier concentrations. The n-type contact layer 130 has a thickness of, for example, 1,000 nm to 10,000 nm. Needless to say, the thickness of the n-type contact layer 130 is not limited thereto.

The n-side ESD layer 140 is an electrostatic breakdown-preventing layer for preventing electrostatic breakdown of a semiconductor layer. The n-side ESD layer 140 is formed on the n-type contact layer 130. The n-side ESD layer 140 is formed by depositing an i-GaN layer formed of non-doped i-GaN and an n-type GaN layer formed of Si-doped n-type GaN. The i-GaN layer has a thickness of, for example, 5 nm to 500 nm. The n-type GaN layer has a thickness of, for example, 10 nm to 50 nm. The n-type GaN layer has a Si concentration of $1 \times 10^{18}/cm^3$ to $5 \times 10^{19}/cm^3$. These values are merely examples, and other values may be employed.

The n-side superlattice layer 150 is a strain relaxation layer for relaxing the stress applied to the light-emitting layer 160. More specifically, the n-side superlattice layer 150 has a superlattice structure. The n-side superlattice layer 150 has a layered structure, in which InGaN layers and n-type GaN layers are repeatedly deposited. The number of repetitions is from 3 to 20, but other number of repetitions may be acceptable. The InGaN layer of the n-side superlattice layer 150 has an In composition ratio of, for example, 2% to 20%. The InGaN layer of the n-side superlattice layer 150 has a thickness of, for example, 0.2 nm to 9 nm. The n-type GaN layer of the n-side superlattice layer 150 has a thickness of, for example, 1 nm to 5 nm.

The light-emitting layer 160 emits light through recombination of an electron with a hole. The light-emitting layer 160 is formed on the n-side superlattice layer 150. The light-emitting layer 160 has at least a well layer and a barrier layer. The well layer may be, for example, an InGaN layer or a GaN layer. The barrier layer may be, for example, a GaN layer or an AlGaN layer. These layers are merely examples, and other layers such as an AlInGaN layer may be employed.

The p-side superlattice layer 170 is formed on the light-emitting layer 160. The p-side superlattice layer 170 is a p-type cladding layer. The p-side superlattice layer 170 is formed by repeatedly depositing a layer unit of a p-type GaN layer, a p-type AlGaN layer, and a p-type InGaN layer. The number of repetitions is, for example, 5. The p-type GaN layer of the p-side superlattice layer 170 has a thickness of 0.5 nm to 7 nm. The p-type AlGaN layer of the p-side superlattice layer 170 has an Al composition ratio of 5% to 40%. The p-type AlGaN layer of the p-side superlattice layer 170 has a thickness of 0.5 nm to 7 nm. The p-type InGaN layer of the p-side superlattice layer 170 has an In composition ratio of, 1% to 20%. The p-type InGaN layer of the p-side superlattice layer 170 has a thickness of 0.5 nm to 7 nm. These values are merely examples. Thus, other values may be acceptable. Moreover, the p-side superlattice layer 170 may have a stacking structure different from the above one.

The p-type intermediate layer 180 is formed on the A-side superlattice layer 170. The p-type intermediate layer 180 has a first p-type GaN layer 181 and a second p-type GaN layer 182. The first p-type GaN layer 181 is a first p-type intermediate layer. The second p-type GaN layer 182 is a second p-type intermediate layer. The first p-type GaN layer 181 and the second p-type GaN layer 182 are both Mg-doped GaN layers. The first p-type GaN layer 181 is formed on the p-side superlattice layer 170. The second p-type GaN layer 182 is formed on the first p-type GaN layer 181. The second p-type GaN layer 182 is in contact with the p-type contact layer 190.

The p-type contact layer 190 is a semiconductor layer electrically connected to the p-electrode P1. Therefore, the p-type contact layer 190 is in contact with the p-electrode P1. The p-type contact layer 190 is formed on the second p-type GaN layer 182 of the p-type intermediate layer 180. The p-type contact layer 190 is a Mg-doped p-type GaN layer.

The p-electrode P1 is formed on the p-type contact layer 190. The p-electrode P1 is in contact with the p-type contact layer 190. The p-electrode P1 is formed of ITO. Other than ITO, transparent, electrically conductive oxides such as ICO, IZO, ZnO, $TiO_2$, $NbTiO_2$, and $TaTiO_2$ may be employed. A metal electrode may be formed on the p-electrode P1, which is made of metal such as Ni, Au, Ag, Co, and In. Or other electrode may be formed on the p-electrode P1.

The n-electrode N1 is formed on the n-type contact layer 130. The n-electrode N1 is in contact with the n-type contact layer 130. The n-electrode N1 includes a V layer and an Al layer sequentially formed from the surface of the n-type contact layer 130. Alternatively, this combination may be Ti and Al, or Ti and Au.

2. P-Type Intermediate Layer and p-Type Contact Layer

2-1. Structure Around p-Type Contact Layer

Figure 2:
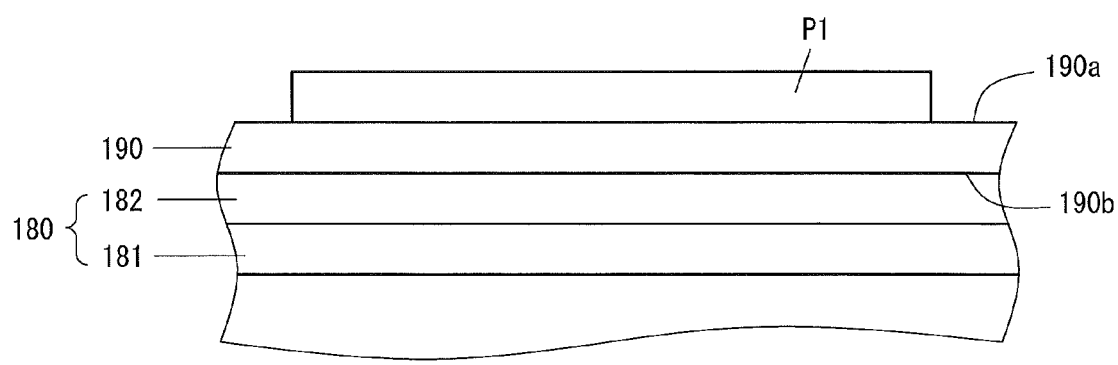
FIG. 2 is a view of the structure in the vicinity of a p-type contact layer according to the embodiment.

FIG. 2 is an enlarged view of the p-type contact layer 190 and other elements in the vicinity of the layer. As shown in FIG. 2, the p-type contact layer 190 has a first surface 190a and a second surface 190b. The first surface 190a of the p-type contact layer 190 is in contact with the p-electrode P1. The second surface 190b of the p-type contact layer 190 is in contact with the second p-type GaN layer 182.

2-2. P-Type Intermediate Layer

The first p-type GaN layer 181 and the second p-type GaN layer 182 are formed of Mg-doped p-type GaN. However, the first p-type GaN layer 181 and the second p-type GaN layer 182 have different Mg concentrations. The first p-type GaN layer 181 has a Mg concentration of $1\times10^{18}/cm^3$ to $4\times10^{19}/cm^3$. The second p-type GaN layer 182 has a Mg concentration of $5\times10^{19}/cm^3$ to $1\times10^{20}/cm^3$. The first p-type GaN layer 181 has a thickness of 5 nm to 250 nm. The second p-type GaN layer 182 has a thickness of 5 nm to 250 nm.

2-3. P-Type Contact Layer

The p-type contact layer 190 has a Mg concentration of $1\times10^{20}/cm^3$ to $1\times10^{22}/cm^3$. The p-type contact layer 190 has a thickness of 0.5 nm to 50 nm, preferably, 0.5 nm to 10 nm, and more preferably, 1 nm to 8 nm.

2-4. Mg Concentration Change Rate of P-Type Contact Layer

The Mg concentration of the p-type contact layer 190 is higher as closer to the p-electrode P1 side from the first p-type GaN layer 181 side, as described later. The Mg concentration change rate X of the p-type contact layer 190 is obtained by the following equation:

$$X=(D1-D2)/Th1 \qquad (1)$$

D1: Mg concentration of p-type contact layer (on the first surface 190a side)

D2: Mg concentration of p-type contact layer (on the second surface 190b side, or on a saturated position of Mg concentration)

Th1: Thickness of p-type contact layer, or a width of a rising area of Mg concentration, or a rising width $1/\alpha$ in a Mg concentration rising function $B-A\exp(-\alpha x)$, x is position along width direction The Mg concentration change rate X is the rate of change in the Mg concentration of the p-type contact layer 190 from the surface in contact with the p-type intermediate layer 180 to the surface in contact with the p-electrode P1. Otherwise, the Mg concentration change rate X is an average value in the rising area, or differential vale at the growth start point of the p-type contact layer.

The Mg concentration change rate X preferably satisfies the following condition.

$$5\times10^{18} \leq X \leq 1\times10^{20} \qquad (2)$$

X: Mg concentration change rate $(cm^{-3} \cdot nm^{-1})$

Thereby, the p-type contact layer 190 has a small thickness and a suitable Mg concentration.

Preferably, the Mg concentration change rate X satisfies the following condition.

$$5\times10^{18} \leq X \leq 5\times10^{19} \qquad (3)$$

X: Mg concentration change rate $(cm^{-3} \cdot nm^{-1})$ More preferably, the Mg concentration change rate X satisfies the following condition.

$$5\times10^{18} \leq X \leq 2\times10^{18} \qquad (4)$$

X: Mg concentration change rate $(cm^{-3} \cdot nm^{-1})$

3. Step of Forming a p-Type Intermediate Layer and a p-Type Contact Layer (p-Type Layer Formation Step)

Next will be described a step of forming a p-type intermediate layer and a p-type contact layer. Hereinafter, the step of forming a p-type intermediate layer and a p-type contact layer is referred to as "the p-type layer formation step". The p-type layer formation step is a step for forming a p-type contact layer 190 through chemical vapor deposition method such as MOCVD. The p-type layer formation step has many variations. These p-type layer formation steps will next be described in order.

The same raw material gases can be employed in common for all the p-type layer formation steps. The raw material gas includes a first raw material gas, a second raw material gas, and a third raw material gas. The first raw material gas is a raw material gas containing a gallium atom (Ga). The first raw material gas includes trimethylgallium (TMG) or triethylgallium (TEG). The second raw material gas is a dopant gas containing a Mg atom. The second raw material gas includes bis(cyclopentadienyl)magnesium ($Mg(C_5H_5)_2$) or bis(ethylcyclopentadienyl)magnesium ($EtCp_2Mg$: $Mg(C_2H_5C_5H_4)_2$). The third raw material gas is a raw material gas containing an nitrogen atom (N). The third raw material gas includes ammonia ($NH_3$) or hydrazine ($N_2H_4$).

3-1. First Formation Method

Figure 3:
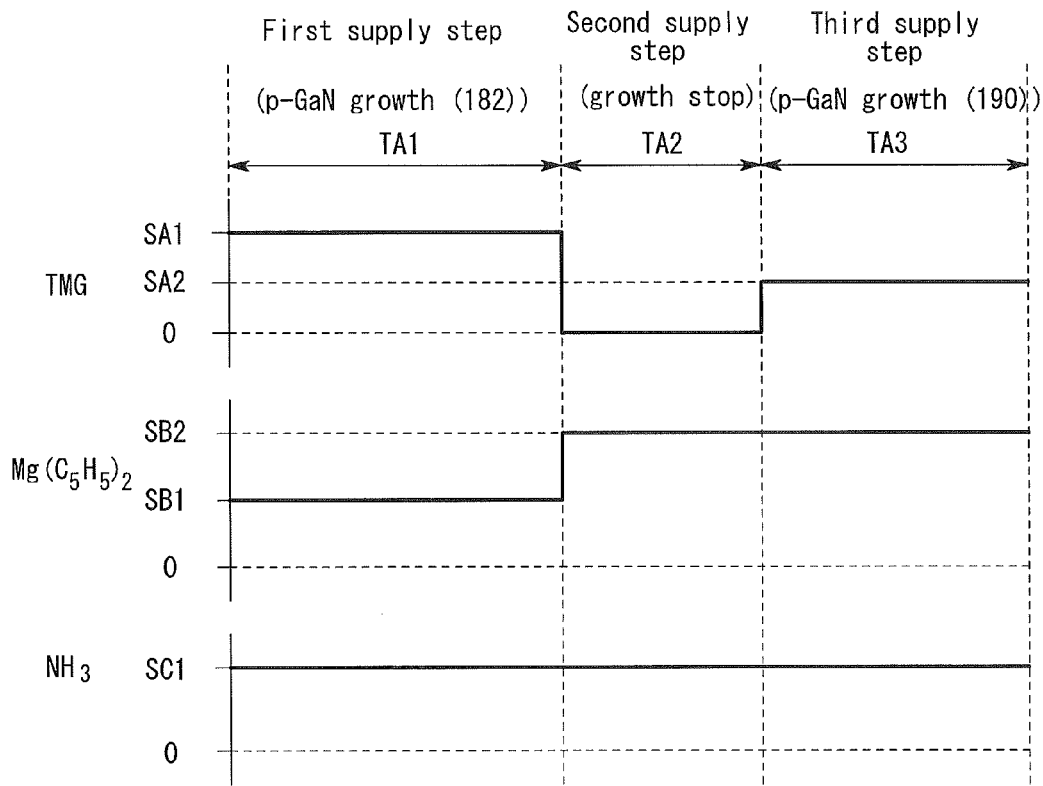
FIG. 3 is a timing chart describing a first method for forming a p-type contact layer of the light-emitting device according to the embodiment.

FIG. 3 is a timing chart showing the supply molar rate (mol/min.) of the raw material gases in the first formation method. Hereinafter, "supply molar rate" is referred to as just "supply amount". Therefore, a carrier gas such as nitrogen or hydrogen is employed other than the raw material gases shown in FIG. 3.

As shown in FIG. 3, the p-type layer formation step comprises a first supply step (p-type intermediate layer formation step), a second supply step (dopant gas supply step), and a third supply step (p-type contact layer formation step). The first supply step (p-type intermediate layer formation step) is a step of forming a second p-type GaN layer 182 of the p-type intermediate layer 180. The second supply step (dopant gas supply step) is the step of filling the inside of a chamber for growing a semiconductor, that is, the surface of a semiconductor crystal with a dopant gas. The third supply step (p-type contact layer formation step) is the step of forming a p-type contact layer 190.

The first supply step supplies TMG, $NH_3$, and $Mg(C_5H_5)_2$ during a first period TA1. The second supply step stops the supply of TMG, and supplies $NH_3$, and $Mg(C_5H_5)_2$ during a second period TA2. The third supply step supplies TMG, $NH_3$, and $Mg(C_5H_5)_2$ during a third period TA3.

3-1-1. First Supply Step (p-Type Intermediate Layer Formation Step)

As shown in FIG. 3, TMG, $NH_3$, $Mg(C_5H_5)_2$ are supplied during the first period TA1. Thereby, a Mg-doped second p-type GaN layer 182 grows. During the first period TA1, TMG is supplied with the supply amount SA1. $Mg(C_5H_5)_2$ is supplied with the supply amount SB1. $NH_3$ is supplied with the supply amount SC1.

3-1-2. Second Supply Step (Dopant Gas Supply Step)

During the second period TA2, the supply of TMG is stopped, and $Mg(C_5H_5)_2$ is supplied. That is, the supply amount of TMG is 0. The supply amount of TMG may be substantially 0, that is, the supply amount of TMG may be reduced to the value in which the Group III nitride semiconductor is not grown. Moreover, the flow rate of the dopant gas may be increased in a step function near the start of the second period.

During the second period TA2, $Mg(C_5H_5)_2$ is supplied with the supply amount SB2. The supply amount SB2 is higher than the supply amount SB1 during the first period TA1. That is, $Mg(C_5H_5)_2$ is increased in a step function from SB1 to SB2. A flow of $Mg(C_5H_5)_2$ on the surface of the substrate 110 is stable during the second period TA2. The supply amount ratio of the dopant gas to the first raw material gas in the dopant gas supply step, is higher than the supply amount ratio of the dopant gas to the first raw material gas in the p-type intermediate layer formation step. $NH_3$ is supplied with the supply amount SC1.

GaN does not grow during the second period TA2 because TMG is not substantially supplied. The chamber is filled with $Mg(C_5H_5)_2$, and the concentration of $Mg(C_5H_5)_2$ is relatively high around the substrate 110. The filling stable level of $Mg(C_5H_5)_2$ depends on the time of the second period TA2, the supply amount of $Mg(C_5H_5)_2$ per minute during the second period TA2. It also depends on the chamber capacity. For example, to achieve a constant and stable concentration of $Mg(C_5H_5)_2$ on the surface of the substrate 110, the time of the second period TA2 is 1 second to 60 seconds, preferably, 3 seconds to 30 seconds, and more preferably, 5 seconds to 20 seconds. However, these depend on the gas flow rate or the chamber capacity.

3-1-3. Third Supply Step (p-Type Contact Layer Formation Step)

During the third period TA3, the supply of TMG is started again. During the third period TA3, TMG is supplied with the supply amount SA2. During the third period successively from the second period TA2, $Mg(C_5H_5)_2$ is supplied with the same supply amount SB2. $NH_3$ is also supplied with the supply amount SC1. The TMG supply amount SA2 is smaller than the supply amount SA1 during the first period TA1. Thus, the supply amount of TMG during the third period TA3 is smaller than the supply amount of TMG during the first period TA1.

Therefore, the film deposition rate during the third period TA3 is lower than the film deposition rate during the first period TA1. Thereby, in the third supply step, the thickens is easily controlled by the supply time, and a p-type contact layer 190 can be formed so as to have a desired small thickness. The supply amount of $Mg(C_5H_5)_2$ during the third period TA3 is larger than the supply amount of $Mg(C_5H_5)_2$ during the first period TA1. However, the supply amount is increased in a step function from the start of the second period TA2, the concentration of $Mg(C_5H_5)_2$ is constant and stable on the surface of the substrate 110, and does not vary with time. Therefore, the Mg concentration of the p-type GaN layer 190 is quickly increased at the start of the growth, resulting in a desired constant high concentration.

In the third supply step, the supply amount ratio of the second raw material gas to the first raw material gas is higher than the supply amount ratio of the second raw material gas to the first raw material gas in the first supply step. That is, the supply amount ratio of $Mg(C_5H_5)_2$ to TMG during the third period TA3 is higher than the supply amount ratio of $Mg(C_5H_5)_2$ to TMG during the first period TA1.

The flow rate of the dopant gas in the dopant gas supply step is higher than the flow rate of the dopant gas in the p-type intermediate layer formation step. Moreover, the flow rate of the dopant gas in the p-type contact layer formation step is higher than the flow rate of the dopant gas in the p-type intermediate layer formation step. The supply amount of dopant gas during the third period TA3 is the same as that during the second period TA2. Therefore, the supply amount ratio of the dopant gas to the first raw material gas in the p-type contact layer formation step is higher than the supply amount ratio of the dopant gas to the first raw material gas in the p-type intermediate layer formation step.

The substrate temperature in the p-type contact layer formation step falls within a range of 800° C. to 1,200° C. The substrate temperature may be kept at a constant temperature within the above temperature range from the first period TA1 to the third period TA3.

3-2. Second Formation Method

Figure 4:
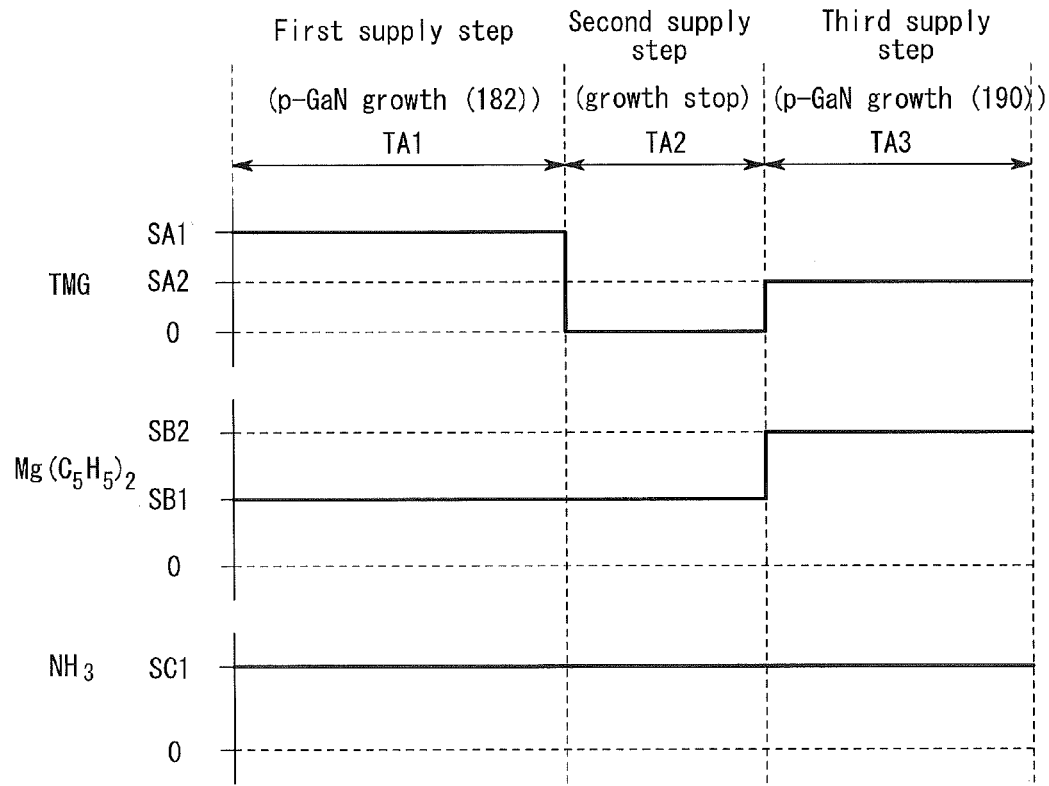
FIG. 4 is a timing chart describing a second method for forming a p-type contact layer of the light-emitting device according to the embodiment.

FIG. 4 is a timing chart showing the supply amounts of the raw material gases in the second formation method. The second formation method comprises a first supply step, a second supply step, and a third supply step as with the first formation method. Here, the first supply step and the third supply step in the second formation method are the same as in the first formation method.

The second formation method differs from the first formation method in the supply amount of $Mg(C_5H_5)_2$ in the second supply step. In the second supply step, $Mg(C_5H_5)_2$ is supplied with the supply amount SB1. That is, the $Mg(C_5H_5)_2$ supply amount SB1 is common both during the first period TA1 and the second period TA2. The $Mg(C_5H_5)_2$ supply amount SB1 in the second supply step of the second formation method is smaller than that in the first formation method.

The flow rate of the dopant gas in the dopant gas supply step, is lower than the flow rate of the dopant gas in the p-type contact layer formation step. The flow rate of the dopant gas in the p-type contact layer formation step, is higher than the flow rate of the dopant gas in the p-type intermediate layer formation step.

3-3. Third Formation Method

Figure 5:
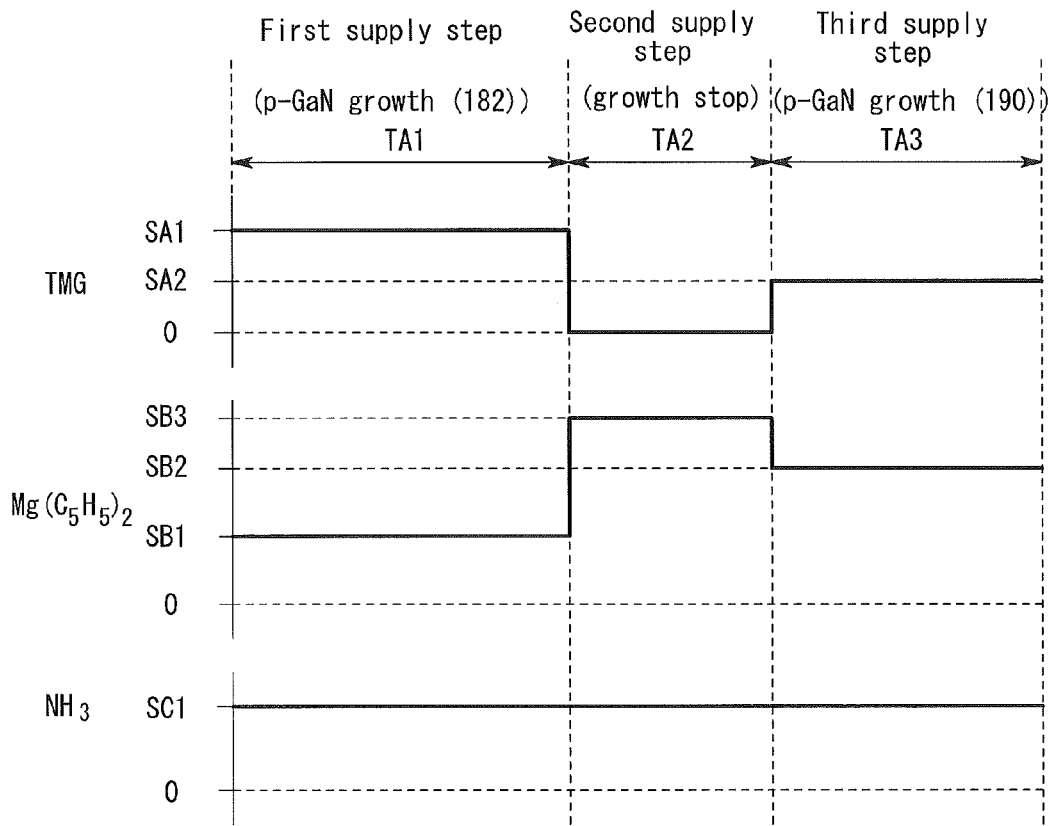
FIG. 5 is a timing chart describing a third method for forming a p-type contact layer of the light-emitting device according to the embodiment.

FIG. 5 is a timing chart showing the supply amounts of the raw material gases in the third formation method. The third formation method comprises a first supply step, a second supply step, and a third supply step as with the first formation method. Here, the first supply step and the third supply step in the third formation method are the same as in the first formation method.

The third formation method differs from the first formation method in the supply amount of $Mg(C_5H_5)_2$ in the second supply step. In the second supply step, $Mg(C_5H_5)_2$ is supplied with the supply amount SB3. The supply amount SB3 is larger than the $Mg(C_5H_5)_2$ supply amount SB2 during the third period TA3. That is, the supply amount ratio of the dopant gas to the first raw material gas in the dopant gas supply step is higher than the supply amount ratio of dopant gas to the first raw material gas in the p-type contact layer formation step. The supply amount SB3 is larger than the $Mg(C_5H_5)_2$ supply amount SB2 in the second supply step of the first formation method.

Therefore, the chamber can be filled with larger amounts of $Mg(C_5H_5)_2$ and its reaction gases. At the start of the p-type contact layer formation step in the second formation method, the concentrations of $Mg(C_5H_5)_2$ and its reaction gases are relatively high around the substrate 110.

The flow rate of the dopant gas in the dopant gas supply step is larger than the flow rate of the dopant gas in the p-type contact layer formation step. The flow rate of the dopant gas in the p-type contact layer formation step is higher than the flow rate of the dopant gas in the p-type intermediate layer formation step.

3-4. Fourth Formation Method

Figure 6:
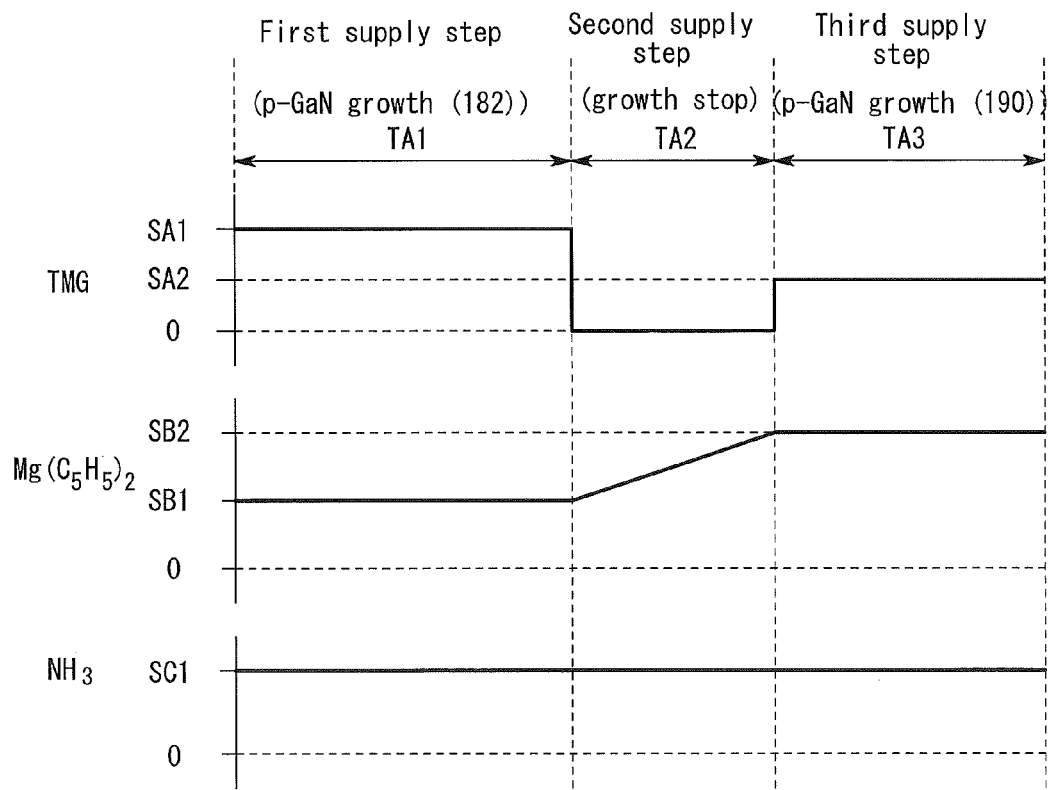
FIG. 6 is a timing chart describing a fourth method for forming a p-type contact layer of the light-emitting device according to an embodiment.

FIG. 6 is a timing chart showing the supply amounts of the raw material gases in the fourth formation method. The fourth formation method comprises a first supply step, a second supply step, and a third supply step as with the first formation method. Here, the first supply step and the third supply step in the fourth formation method are the same as in the first formation method.

The fourth formation method differs from the first formation method in the supply amount of $Mg(C_5H_5)_2$ in the second supply step. In the second supply step, the supply amount of $Mg(C_5H_5)_2$ is gradually increased from the supply amount SB1 to the supply amount SB2. That is, in the dopant gas supply step, the supply amount of dopant gas is gradually increased as the time passes. Even in such a case, a p-type contact layer 190 having a small thickness and a high Mg concentration can be preferably formed.

In FIG. 6, $Mg(C_5H_5)_2$ is supplied by the supply amount SB2 at the end of the second supply step. However, the supply amount of $Mg(C_5H_5)_2$ may be gradually increased after the start of the second period TA2, and $Mg(C_5H_5)_2$ may be supplied at a constant amount SB2 from the middle of the second period TA2 to the end of the second period TA2.

3-5. Fifth Formation Method

Figure 7:
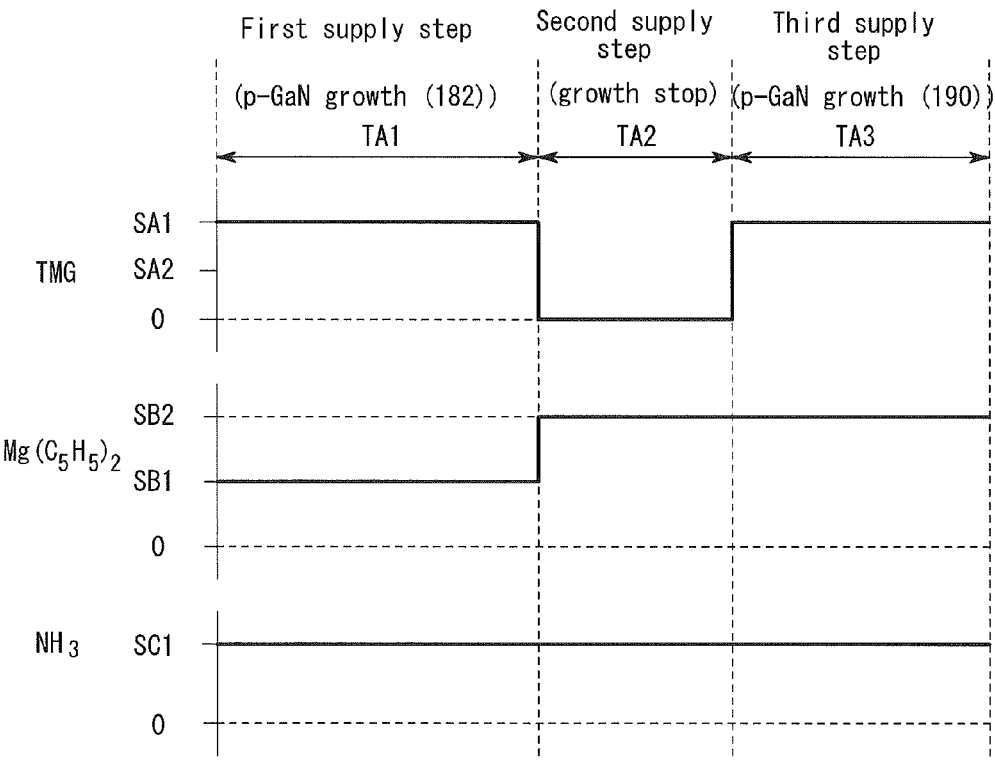
FIG. 7 is a timing chart describing a fifth method for forming a p-type contact layer of the light-emitting device according to the embodiment.

FIG. 7 is a timing chart showing the supply amounts of raw material gases in the fifth formation method. The fifth formation method comprises a first supply step, a second supply step, and a third supply step as with the first formation method. Here, the first supply step and the second supply step in the fifth formation method are the same as for the first formation method.

The fifth formation method differs from the first formation method in the supply amount of TMG in the third supply step. In the third supply step, TMG is supplied with the supply amount SA1. That is, the TMG supply amount SA1 in the third supply step is the same as the TMG supply amount SA1 in the first supply step. Therefore, the film deposition rate in the third supply step is almost same as the film deposition rate in the first supply step. That is, the supply amount of the first raw material gas in the p-type contact layer formation step is equal to the supply amount of the first raw material gas in the p-type intermediate layer formation step.

3-6. Sixth Formation Method

Figure 8:
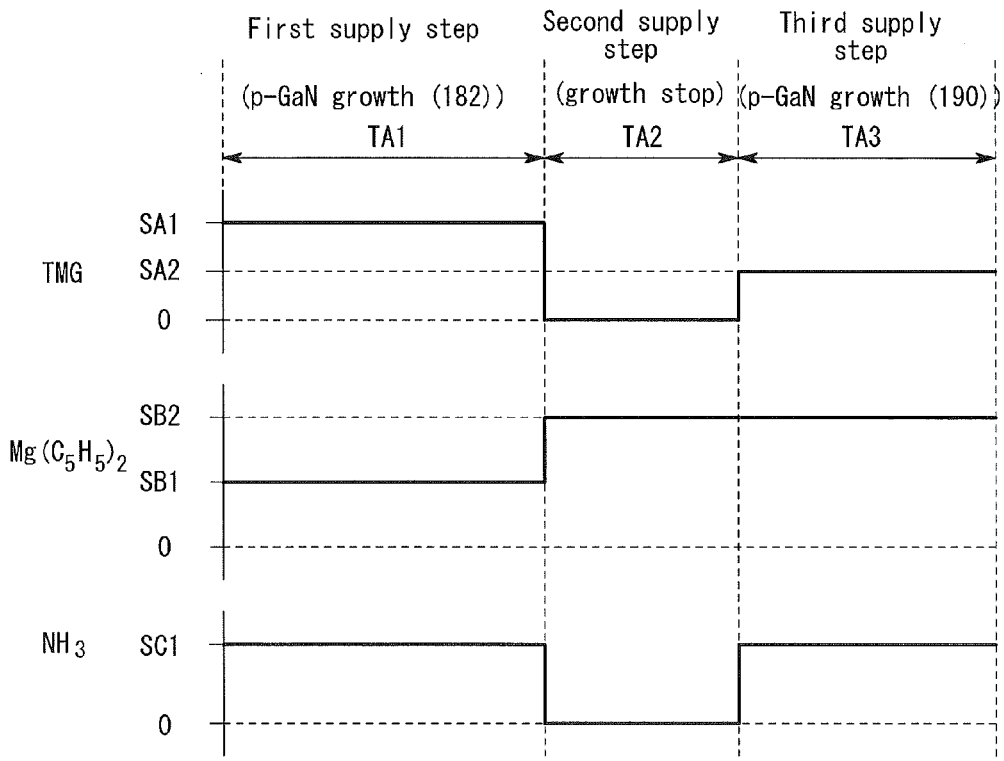
FIG. 8 is a timing chart describing a sixth method for forming a p-type contact layer of the light-emitting device according to an embodiment.

FIG. 8 is a timing chart showing the supply amounts of the raw material gases in the sixth formation method. The sixth formation method comprises a first supply step, a second supply step, and a third supply step as in the first formation method. Here, the first supply step and the third supply step in the sixth formation method are the same as in the first formation method.

The sixth formation method differs from the first formation method in the supply amount of $NH_3$ in the second supply step. In the sixth formation method, $NH_3$ is not supplied in the second supply step, that is, during the second period TA2. Since a p-type GaN is not grown in the second supply step, the supply of $NH_3$ may be stopped. In other words, the third raw material gas containing N is supplied in the p-type intermediate layer formation step and the p-type contact layer formation step, and the supply of the third raw material gas is stopped in the dopant gas supply step. Thereby, the usage of $NH_3$ can be reduced. That is, the third raw material gas containing a nitrogen atom is supplied in the p-type intermediate layer formation step and the p-type contact layer formation step, and the supply of the third raw material gas is stopped in the dopant gas supply step.

3-7. From First Formation Method to Sixth Formation Method

As described above, from the first formation method to the sixth formation method, the molar ratio of the dopant gas to the first raw material gas in the dopant gas supply step, is higher than the molar ratio of the dopant gas to the first raw material gas in the p-type intermediate layer formation step. Moreover, the molar ratio of the dopant gas to the first raw material gas in the p-type contact layer formation step, is higher than the molar ratio of the dopant gas to the first raw material gas in the p-type intermediate layer formation step.

4. Method for Forming Semiconductor Light-Emitting Device

Next will be described a method for producing the light-emitting device 100 according to the present embodiment. In the present embodiment, the semiconductor crystal layers are formed through epitaxial growth based on metalorganic chemical vapor deposition (MOCVD). Accordingly, the production method includes the following: an n-type semiconductor layer formation step of forming an n-type semiconductor layer, a light-emitting layer formation step of forming a light-emitting layer on the n-type semiconductor layer, a p-type semiconductor layer formation step of forming a p-type semiconductor layer on the light-emitting layer, a p-electrode formation step of forming a p-electrode on the p-type semiconductor layer, and an n-electrode formation step of forming an n-electrode on the n-type semiconductor layer. The p-type semiconductor layer formation step comprises the following: a p-type cladding layer formation step of forming a p-type cladding layer on the light-emitting layer by supplying a first raw material gas containing at least a Group III element and a dopant gas; a p-type intermediate layer formation step of forming a p-type intermediate layer on the p-type cladding layer by supplying a first raw material gas and a dopant gas; a dopant gas supply step of supplying the dopant gas while stopping the supply of the first raw material gas after the p-type intermediate layer formation step; and a p-type contact layer formation step of forming a p-type contact layer on the p-type intermediate layer by supplying the first raw material gas and the dopant gas after the dopant gas supply step. The third raw material gas containing N continues to flow through all the steps.

The p-type semiconductor layer formation step comprises the following: a p-type intermediate layer formation step of forming a p-type intermediate layer by supplying a first raw material gas containing at least Ga and a dopant gas containing Mg, a dopant gas supply step of supplying the dopant gas while stopping the supply of the first raw material gas, and a p-type contact layer formation step of forming a p-type contact layer by supplying at least the first raw material gas and the dopant gas.

Examples of the carrier gas employed in the growth of semiconductor layers include hydrogen ($H_2$), nitrogen ($N_2$), and a mixture of hydrogen and nitrogen ($H_2+N_2$). Unless otherwise specified in the steps described later, any carrier gas may be employed. Ammonia gas ($NH_3$) is used as a nitrogen source. Trimethylgallium ($Ga(CH_3)_3$: "TMG") is used as a gallium source. Trimethylindium ($In(CH_3)_3$: "TMI") is used as an indium source, and trimethylaluminum ($Al(CH_3)_3$: "TMA") is used as an aluminum source. Silane ($SiH_4$) is used as an n-type dopant gas, and bis(cyclopentadienyl)magnesium ($Mg(C_5H_5)_2$: hereinafter, referred to as "$Cp_2Mg$") is used as a p-type dopant gas.

4-1. n-Type Semiconductor Layer Formation Step 4-1-1. n-Type Contact Layer Formation Step Firstly, the substrate 110 is cleaned with hydrogen gas. Then, the buffer layer 120 is formed on the main surface of the substrate 110, and the n-type contact layer 130 is formed on the buffer layer 120 with supplying silane ($SiH_4$). During the above layer formation, the substrate temperature is 1,000° C. to 1,200° C.

4-1-2. n-Side ESD Layer Formation Step

Subsequently, the n-side ESD layer 140 is formed on the n-type contact layer 130. For forming the i-GaN layer, the supply of silane ($SiH_4$) is stopped. In this procedure, the substrate temperature is, for example, 750° C. to 950° C. Then, for forming n-type GaN, the supply of silane ($SiH_4$) is started again. In the subsequent procedure, the substrate temperature is 750° C. to 950° C., which is the same range as employed in the formation of the i-GaN layer.

4-1-3. n-Side Superlattice Layer Formation Step

Then, the n-side superlattice layer 150 is formed on the n-side ESD layer 140. In one specific mode, InGaN layers and n-type GaN layers are repeatedly deposited. In this procedure, the substrate temperature is, for example, 700° C. to 950° C.

4-2. Light-Emitting Layer Formation Step

On the n-side superlattice layer 150, the light-emitting layer 160 is formed. In one specific mode, InGaN layers, GaN layers, and AlGaN layers are repeatedly deposited. In this procedure, the substrate temperature is, for example, 700° C. to 900° C.

4-3. p-Type Semiconductor Layer Formation Step 4-3-1. p-Side Superlattice Layer Formation Step (p-Type cladding layer formation step)

On the light-emitting layer 160, the p-side superlattice layer 170 is formed. In one specific mode, p-type GaN layers, p-type AlGaN layers, and p-type InGaN layers are repeatedly deposited.

Figure 9:
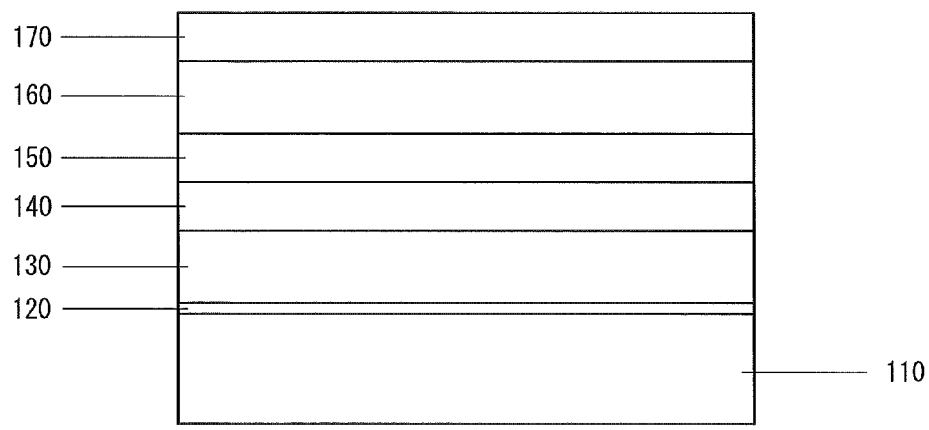
FIG. 9 is a schematic view (part 1) describing a method for producing the light-emitting device according to the embodiment.

Bis(cyclopentadienyl)magnesium ($Mg(C_5H_5)_2$) may be used as a p-type dopant gas. Thereby, the layered structure shown in FIG. 9 is obtained.

4-3-2. p-Type Intermediate Layer Formation Step

In the p-type intermediate layer formation step and the p-type contact layer formation step, any one of the first formation method to the sixth formation method described above is used. The p-type intermediate layer formation step comprises the steps of forming a first p-type intermediate layer on the p-side superlattice layer 170, and forming a second p-type intermediate layer on the first p-type intermediate layer.

In this step, on the p-side superlattice layer 170, the first p-type GaN layer 181 is formed. When forming the first p-type GaN layer 181, the p-type dopant gas is not supplied. However, the first p-type GaN layer 181 is doped with Mg by the memory effect of the dopant gas employed in forming p-side superlattice layer. Then, on the first p-type GaN layer 181, the second p-type GaN layer 182 is formed. When forming the second p-type GaN layer 182, the p-type dopant gas is supplied.

Subsequently, when forming the p-type intermediate layer 180, at least nitrogen gas is supplied as a carrier gas. For example, a mixture of hydrogen and nitrogen ($H_2+N_2$) is employed. The molar ratio of nitrogen atom in this carrier gas is within a range of 20% to 80%, preferably, 30% to 80%, and more preferably, 40% to 70%.

Hydrogen gas promotes the migration of constituent atoms, thereby improving the surface flatness of the layers. Instead, hydrogen atoms are sometimes incorporated in the crystal and combined with Mg. In this case, hydrogen gas inhibits the activation of Mg. On the contrary, nitrogen gas inhibits the decomposition of the crystal, thereby preventing desorption of nitrogen atoms from the crystal.

4-3-3. p-Type Contact Layer Formation Step

Figure 10:
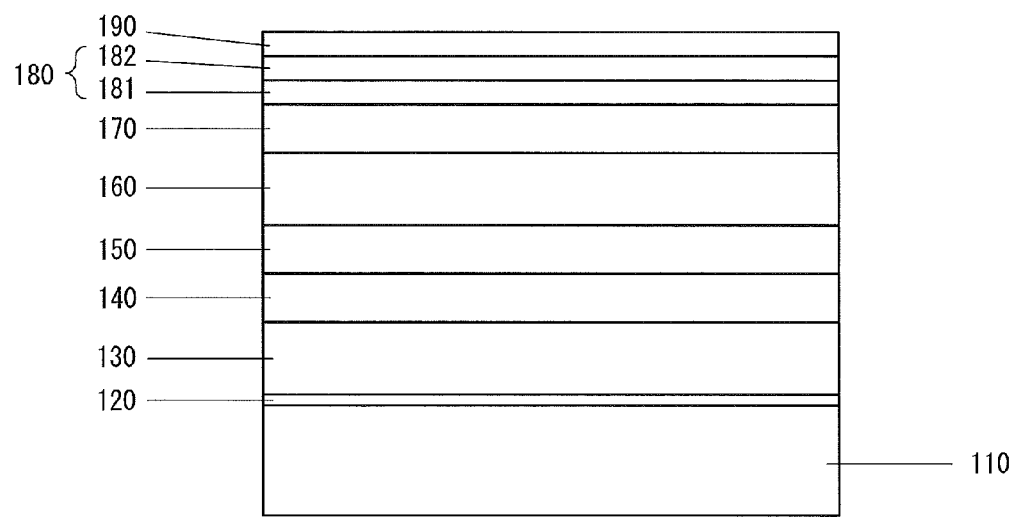
FIG. 10 is a schematic view (part 2) describing a method for producing the light-emitting device according to the embodiment.

On the p-type intermediate layer 180, the p-type contact layer 190 is formed. At least hydrogen gas is supplied as a carrier gas, thereby improving the surface flatness of the p-type contact layer 190. The substrate temperature is adjusted to fall within a range of 800° C. to 1,200° C. Through this procedure, these semiconductor layers are deposited on the substrate 110, as shown in FIG. 10.

4-4. Electrode Formation Step

Figure 11:
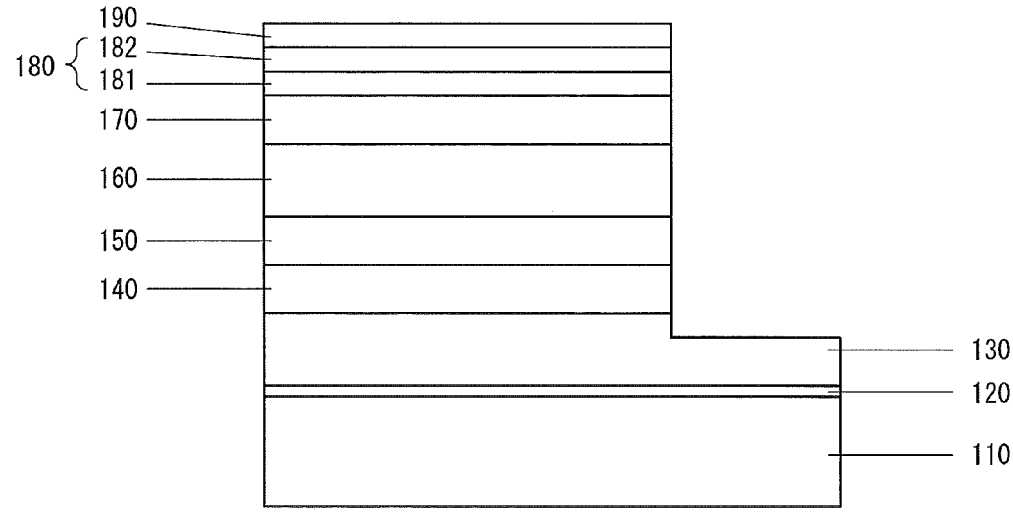
FIG. 11 is a schematic view (part 3) describing a method for producing the light-emitting device according to the embodiment.

Then, the p-electrode P1 is formed on the p-type contact layer 190. As shown in FIG. 11, the semiconductor layers are partially removed through laser radiation or etching from the p-type contact layer 190 side, to thereby expose the n-type contact layer 130. Then, the n-electrode N1 is formed on the thus-exposed region. Either of the p-electrode P1 formation step and the n-electrode N1 formation step may be performed.

4-5. Other Steps

In addition to the aforementioned steps, additional steps such as a step of covering the device with a protective film and a heat treatment step may be carried out. In this way, the light-emitting device 100 shown in FIG. 1 is produced.

5. Effects of the Present Embodiment

The method for producing the semiconductor light-emitting device 100 of the present embodiment includes the second period TA2 between the first period TA1 and the third period TA3, in which the deposition of the semiconductor layer is stopped and the dopant gas is supplied. The p-type contact layer 190 of the light-emitting device 100 produced by this production method can have a small thickness and a high Mg concentration. Thus, a thin Schottky barrier allowing easy tunneling is formed between the p-type contact layer 190 and the p-electrode P1. That is, the drive voltage of the light-emitting device 100 is lower than that of the conventional light-emitting device.

In the method for producing the semiconductor light-emitting device 100 according to the present embodiment, the deposition rate can be sufficiently decreased in the third supply step. Therefore, the thickness of the p-type contact layer 190 of the light-emitting device 100 is easy to adjust. Accordingly, a deviation of drive voltage among lots is smaller than that of the conventional light-emitting device.

6. Variation 6-1. Combination
In Embodiment 1, the p-type layer formation steps of the first formation method to the sixth formation method are described. These may be freely combined.
6-2. Substrate Temperature
In Embodiment 1, the substrate temperature was constant in the p-type layer formation step. However, during the p-type layer formation step, the substrate temperature may be raised. For example, the substrate temperature is raised during the second period TA2. Thereby, Mg is easy to incorporate into the p-type contact layer 190. The substrate temperature is preferably within a range of 800° C. to 1,200° C.
6-3. Repetitive Formation of p-Type Layer
The first p-type GaN layer 181, the second p-type GaN layer 182, and the p-type contact layer 190 of Embodiment 1 may be repeatedly formed. The number of repetitions is within a range of 2 to 100.
6-4. Flip-Chip Type, Substrate Lift-Off Type
In the present embodiment, the present invention was applied to a face-up type light-emitting device 100. However, needless to say, the present invention may be applied to a flip-chip type light-emitting device having a light-extraction face on the substrate or a light-emitting device produced through substrate lift-off.
6-5. Number of p-Type Intermediate Layers
In the present embodiment, the p-type intermediate layer 180 comprises two layers of the first p-type GaN layer 181 and the second p-type GaN layer 182. However, the p-type intermediate layer 180 may comprise one layer or not less than three layers.
6-6. Types of p-Type Intermediate Layer
In the present embodiment, the p-type intermediate layer 180 is formed by depositing the first p-type GaN layer 181 and the second p-type GaN layer 182. However, the p-type intermediate layer 180 may be formed of p-type Group III nitride semiconductor other than p-type GaN.

7. Summary of the Present Embodiment

As described hereinabove, the light-emitting device 100 according to the present embodiment has a p-type contact layer 190 having a small thickness and a high Mg concentration. Therefore, the contact resistance between the p-electrode P1 and the p-type contact layer 190 is small, thereby achieving a semiconductor light-emitting device having a low drive voltage.

The method for producing the semiconductor light-emitting device according to the present embodiment has the second period TA2. The Mg concentration of the p-type contact layer 190 is easy to control by adjusting the time length of the second period TA2 or the supply amount during that time.

The above-described embodiment is only an example. Therefore, needless to say, various modifications and variations may be made in the present invention without departing from the scope of the invention. The structure of the layered product is not necessarily limited to one shown in the drawings. For example, any layered structure may be selected, or any number of layer units may be determined for forming each layer. Crystal growth is not necessarily carried out through metal-organic chemical vapor deposition (MOCVD), and any other crystal growth method employing a carrier gas may be employed.

Example

Figure 12:
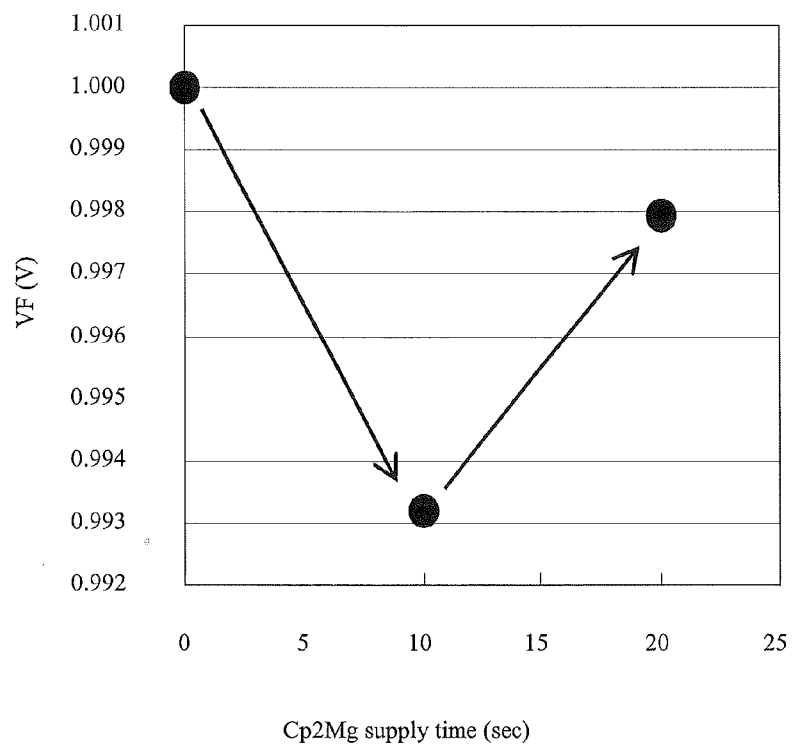
FIG. 12 is a graph showing the relationship between the second supply time (second period) and the drive voltage VF.

1. Drive Voltage 1-1. Preparation of Samples
The p-type intermediate layer 180 and the p-type contact layer 190 were prepared by the first formation method described in the present embodiment. More specifically, the semiconductor light-emitting device was prepared, in which the length of the second period TA2 was varied in the second supply step. Drive voltage was measured for the light-emitting devices produced with different length of the second period TA2.
1-2. Experimental Results
FIG. 12 is a graph showing the relationship between the time length of the second supply step and the drive voltage. The horizontal axis of FIG. 12 shows the second supply time, and the vertical axis shows the drive voltage. In FIG. 12, the relative values were plotted with the drive voltage when the second supply time is 0 second defined as 1 (reference).

As shown in FIG. 12, when the second supply time is 10 seconds, the drive voltage was 0.993. That is, the drive voltage was reduced by 0.7% by performing the second supply step only for 10 seconds. Moreover, when the second supply time is 20 seconds, the drive voltage was 0.998. That is, the drive voltage was reduced by 0.2% by performing the second supply step only for 20 seconds. In this way, the drive voltage is improved by performing the second supply step.

As is clear from FIG. 12, the light-emitting device in which the second supply step was performed only for 20 seconds has a drive voltage higher than the light-emitting device in which the second supply step was performed only for 10 seconds. This is considered because as the length of the second period TA2 is increased in the second supply step, the Mg concentration of the p-type contact layer 190 is excessively increased, thereby rather deteriorating the crystal quality. Moreover, the Mg concentration of the p-type contact layer 190 also depends on the supply concentration of dopant gas containing Mg and the length of the first period TA1 in the first supply step and the supply concentration of dopant gas containing Mg in the third supply step, i.e., the p-type contact layer formation step as well as the length of the second period TA2 of the second supply step. However, to effectively achieve a desired Mg concentration for the very thin p-type contact layer 190, the second period TA2 or the supply amount SB2 and SB3 of Mg(C$_5$H$_5$)$_2$ may be appropriately adjusted. These numeric values are not limited to specific values. However, to shorten the cycle time and improve the production efficiency, the time of the second period TA2 is 1 second to 60 seconds, preferably 3 second to 30 seconds, and more preferably, 5 to 20 seconds.

2. Electrostatic Breakdown Voltage 2-1. Preparation of Samples

Experimental samples were prepared in the same way as in the above experiments of the drive voltage.

2-2. Experimental Results

Figure 13:
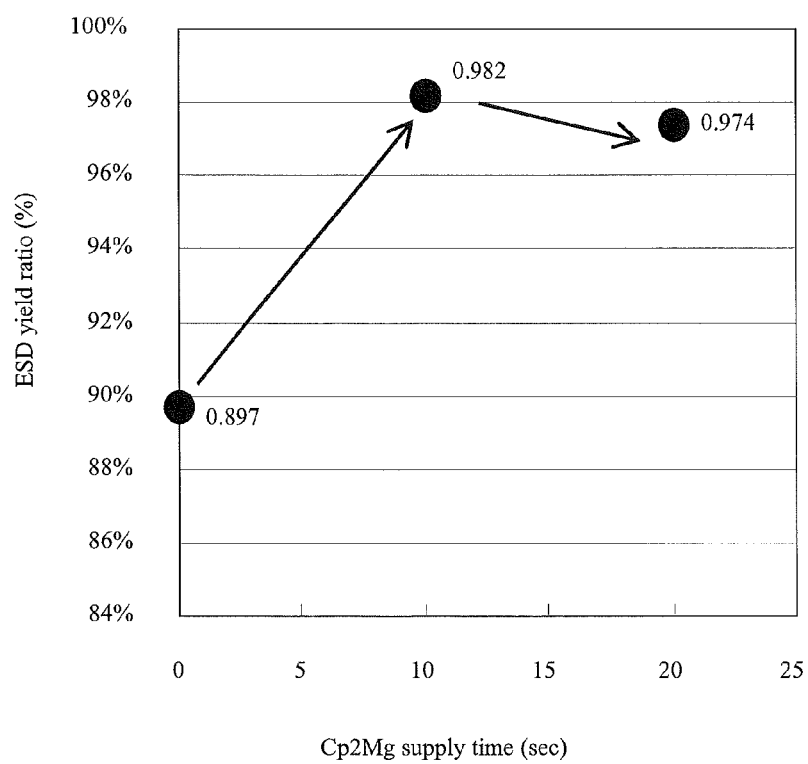
FIG. 13 is a graph showing the relationship between the second supply time (second period) and the ESD yield ratio.

FIG. 13 is a graph showing the relationship between the second supply time and a yield ratio of the accepted product with respect to an assessment of ESD (electrostatic discharge) which is hereinafter referred to as just "ESD yield ratio". The horizontal axis of FIG. 13 shows the time length of the second supply step and the vertical axis of FIG. 13 shows the ESD yield ratio.

As shown in FIG. 13, when the time length of the second supply step is 0 second, the ESD yield ratio was 0.897. When the time length of the second supply step is 10 seconds, the ESD yield ratio was 0.982. When the time length of the second supply step is 20 seconds, the ESD yield ratio was 0.974.

Thus, when the time length of the second supply step is 10 seconds, the ESD yield ratio was improved by 0.085 (8.5%). When the time length of the second supply step is 20 seconds, the ESD yield ratio was improved by 0.077 (7.7%).

In either case when the time length of the second supply step is 10 seconds or 20 seconds in the ESD test, the ESD yield ratio was improved to the same extent. However, the ESD yield ratio was more improved in the light-emitting device in which the time length of the second supply step is 10 seconds than the light-emitting device in which the time length of the second supply step is 20 seconds.

As the length of the second period TA2 of the second supply step is increased, the Mg concentration of the p-type contact layer 190 is excessively increased. This deteriorates the crystallinity of the p-type contact layer 190, and electrostatic breakdown voltage is decreased. The Mg concentration of the p-type contact layer 190 depends on the supply concentration of dopant gas containing Mg and the length of the first period TA1 in the first supply step, and the supply concentration of dopant gas containing Mg in the p-type contact layer formation step as well as the length of the second period TA2 of the second supply step. However, to effectively achieve a desired Mg concentration of the p-type contact layer 190, the second period TA2 or the supply amount SB2 and SB3 of Mg(C$_5$H$_5$)$_2$ may be appropriately adjusted. These numeric values are not limited to specific values. However, to shorten the cycle time and improve the production efficiency, the time of the second period TA2 is 1 second to 60 seconds, preferably 3 second to 30 seconds, and more preferably, 5 to 20 seconds.

3. Mg Concentration of p-Type Contact Layer 3-1. Preparation of Samples

Firstly, semiconductor layers corresponding to a buffer layer 120, an n-type contact layer 130, an n-side ESD layer 140, an n-side superlattice layer 150, a light-emitting layer 160, and a p-side superlattice layer 170 were formed on a sapphire substrate. Subsequently, semiconductor layers corresponding to a p-type intermediate layer 180 and a p-type contact layer 190 were formed thereon by the first formation method described in the embodiment. More specifically, samples were prepared, in which the length of the second period TA2 in the second supply step is 10 seconds (Examples) and 0 second (Comparative examples). The length of the third period TA3 was varied. A plurality of samples having different thickness of the p-type contact layer was prepared. Varying the length of the third period TA3 means varying the thickness of the p-type contact layer.

3-2. Measurement Method

For the samples prepared by varying the lengths of the second period TA2 and the third period TA3, the Mg concentration contained in the p-type contact layer was measured using a Glow Discharge Spectrometer (GDS).

3-3. Experimental Results

Table 1 shows the results of the experiments. In example, a dopant gas supply step (second supply step) was performed. In comparative example, a dopant gas supply step (second supply step) was not performed. The Mg concentration measured using a GDS was defined as 1 (reference) in the case of example 1 (normalized by the value of example 1). In example 1, the thickness of the p-type contact layer was set to 21 Å, and a dopant gas supply step (second supply step) was performed for 10 seconds.

As shown in Table 1, in examples 1 to 4, the Mg concentration (relative value) was 1 or more. On the other hand, in comparative examples 1 to 6, the Mg concentration (relative value) was less than 1. That is, the Mg concentration is higher in examples 1 to 4 in which a dopant gas supply step was performed than that in comparative examples 1 to 6. In other words, by performing a dopant gas supply step, the degree of Mg incorporation into the p-type contact layer is improved.

Figure 14:
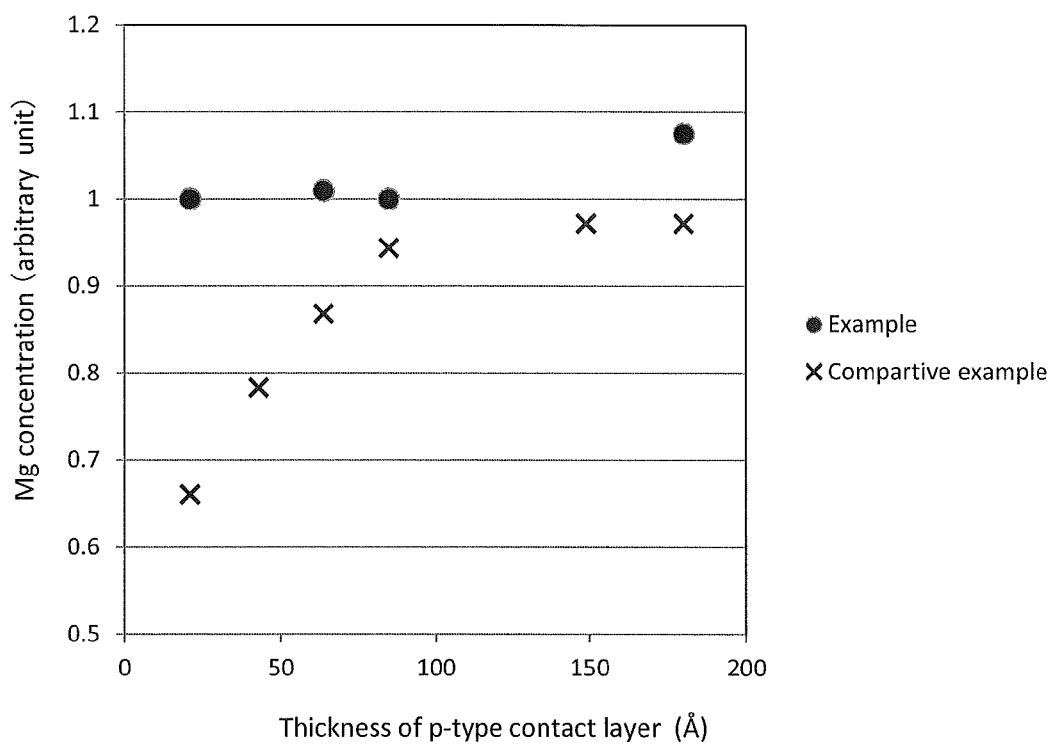
FIG. 14 is a graph showing the relationship between the thickness of the p-type contact layer and the measured Mg concentration of the p-type contact layer.

FIG. 14 is a graph showing the relationship between the thickness of the p-type contact layer and Mg concentration of the p-type contact layer in Table 1. As shown in FIG. 14, in comparative examples, in a range where the thickness of the p-type contact layer is thin, the Mg concentration is not so high. As the thickness of the p-type contact layer is increased, the Mg concentration is increased. In comparative examples, Mg is difficult to be incorporated into the p-type contact layer at an initial stage of the p-type contact layer formation step. As growth proceeds, the thickness is increased, and thus the Mg concentration of the p-type contact layer is increased.

In comparative examples, when the thickness of the p-type contact layer is not more than 100 Å, a slightly different thickness of the p-type contact layer affects the Mg concentration. Therefore, dispersion easily occurs in the characteristics of the p-type contact layer depending on the production conditions. Accordingly, in comparative examples, when the thickness of the p-type contact layer is not more than 100 Å, it is difficult to adjust the Mg concentration. Such dispersion may make the device characteristics unstable. As shown in FIG. 14, to obtain the p-type contact layer having a high Mg concentration, a certain thickness is required. Therefore, to obtain the p-type contact layer having a sufficient Mg concentration, the p-type contact layer must be designed so as to increase the thickness thereof. As the thickness of the p-type contact layer is increased, the electric resistance of the p-type contact layer is increased.

As shown in FIG. 14, the Mg concentration of the p-type contact layer in examples 1 to 4 does not depend on the thickness of the p-type contact layer, and is almost constant. The Mg concentration of the p-type contact layer in examples 1 to 4 is sufficiently higher than that in comparative examples 1 to 6. In a range where the thickness of the p-type contact layer is not less than 5 Å and not more than 100 Å, there is a difference in Mg concentration between examples and comparative examples. In a range where the thickness of the p-type contact layer is not less than 5 Å and not more than 80 Å, a difference in Mg concentration between examples and comparative examples is relatively large. In a range where the thickness of the p-type contact layer is not less than 5 Å and not more than 50 Å, a different in Mg concentration is extremely large between examples and comparative examples.

Thus, a p-type contact layer having a sufficiently small thickness and a high Mg concentration can be formed by using the method for producing a semiconductor light-emitting device described in the embodiment. Therefore, the drive voltage of the light-emitting device 100 according to the embodiment is sufficiently low.

TABLE 1

|  |  | Dopant gas supply step | p-type contact layer formation step | | p-type contact layer |
|---|---|---|---|---|---|
|  |  | (TA2) time (sec) | (SB2) Cp$_2$Mg flow rate (sccm) | thick-ness (Å) | SB2 Cp$_2$Mg flow rate (sccm) | GDS Mg value (relative value) |
| Example | 1 | 10 | 610 | 21 | 610 | 1.00 |
|  | 2 | 10 | 610 | 64 | 610 | 1.01 |
|  | 3 | 10 | 610 | 85 | 610 | 1.00 |
|  | 4 | 10 | 610 | 180 | 610 | 1.08 |
| Comparative Example | 1 | 0 | 0 | 21 | 610 | 0.66 |
|  | 2 | 0 | 0 | 43 | 610 | 0.78 |
|  | 3 | 0 | 0 | 64 | 610 | 0.87 |
|  | 4 | 0 | 0 | 85 | 610 | 0.94 |
|  | 5 | 0 | 0 | 149 | 610 | 0.97 |
|  | 6 | 0 | 0 | 180 | 610 | 0.97 |

3-4. Mg Concentration Change Rate

The Mg concentration change rate of the p-type contact layer was about $1 \times 10^{18}$ (cm$^{-3}$·nm$^{-1}$) in comparative examples. On the other hand, the Mg concentration change rate of the p-type contact layer was about $5 \times 10^{18}$ (cm$^{-3}$·nm$^{-1}$) in examples. Moreover, the Mg concentration change rate can be adjusted up to about $1 \times 10^{23}$ (cm$^{-3}$·nm$^{-1}$) by changing the conditions of the dopant gas supply step and the p-type contact layer formation step. The conditions for increasing the Mg concentration change rate include increasing the length of second period TA2, increasing the supply amount SB2 and SB3 of dopant gas in the second period TA2, stopping the supply of TMG in the second period TA2 and decreasing the supply amount SA2 of TMG in the third period TA3. The Mg concentration of the p-type contact layer is within a range of $1 \times 10^{20}$/cm$^3$ to $1 \times 10^{22}$/cm$^3$.

What is claimed is:

1. A method for producing a Group III nitride semiconductor light-emitting device, the method comprising:
   forming an n-type semiconductor layer;
   forming a light-emitting layer on the n-type semiconductor layer; and
   forming a p-type semiconductor layer on the light-emitting layer;
   wherein the forming the p-type semiconductor layer comprising:
   forming a p-type cladding layer on the light-emitting layer by supplying a first raw material gas containing at least a Group III element and a dopant gas;
   forming a p-type intermediate layer on the p-type cladding layer by supplying the first raw material gas and the dopant gas in a first period; and
   supplying the dopant gas in a second period while stopping the supply of the first raw material gas or reducing the supply amount of the first raw material gas so that the Group III nitride semiconductor is not grown within the second period after forming the p-type intermediate layer; and
   forming a p-type contact layer on the p-type intermediate layer by supplying the first raw material gas and the dopant gas in a third period after the supplying the dopant gas in the second period.

2. The method for producing the Group III nitride semiconductor light-emitting device according to claim 1, wherein a molar ratio of the dopant gas to the first raw material gas in supplying the dopant gas in the second period is higher than a molar ratio of the dopant gas to the first raw material gas in forming the p-type intermediate layer.

3. The method for producing the Group III nitride semiconductor light-emitting device according to claim 1, wherein a molar ratio of the dopant gas to the first raw material gas in forming the p-type contact layer is higher than the molar ratio of the dopant gas to the first raw material gas in forming the p-type intermediate layer.

4. The method for producing the Group III nitride semiconductor light-emitting device according to claim 1, wherein a flow rate of the dopant gas in supplying the dopant gas in the second period is higher than a flow rate of the dopant gas in forming the p-type intermediate layer, and a flow rate of the dopant gas in forming the p-type contact layer is higher than the flow rate of the dopant gas in forming the p-type intermediate layer.

5. The method for producing the Group III nitride semiconductor light-emitting device according to claim 1, wherein the flow rate of the dopant gas in supplying the dopant gas in the second period is lower than the flow rate of the dopant gas in forming the p-type contact layer, and the flow rate of the dopant gas in forming the p-type contact layer is higher than the flow rate of the dopant gas in forming the p-type intermediate layer.

6. The method for producing the Group III nitride semiconductor light-emitting device according to claim 1, wherein the flow rate of the dopant gas in supplying the dopant gas in the second period is higher than the flow rate of the dopant gas in forming the p-type contact layer, and the flow rate of the dopant gas in forming the p-type contact layer is higher than the flow rate of the dopant gas in forming the p-type intermediate layer.

7. The method for producing the Group III nitride semiconductor light-emitting device according to claim 1, wherein the supply amount of the dopant gas is gradually increased in supplying the dopant gas in the second period.

8. The method for producing the Group III nitride semiconductor light-emitting device according to claim 1, wherein the supply amount of the first raw material gas in forming the p-type contact layer is equal to the supply amount of the first raw material gas in forming the p-type intermediate layer.

9. The method for producing the Group III nitride semiconductor light-emitting device according to claim 1, wherein a third raw material gas containing a nitrogen atom is supplied in forming the p-type intermediate layer and forming the p-type contact layer, and the supply of the third raw material gas is stopped in supplying the dopant gas in the second period.

10. The method for producing the Group III nitride semiconductor light-emitting device according to claim 1, wherein the forming the p-type intermediate layer comprises forming a first p-type intermediate layer on the p-type cladding layer, and forming a second p-type intermediate layer on the first p-type intermediate layer.

11. The method for producing the Group III nitride semiconductor light-emitting device according to claim 1, wherein supplying the dopant gas in the second period is performed within a range of 1 second to 60 seconds.

12. The method for producing the Group III nitride semiconductor light-emitting device according to claim 1, wherein the first raw material gas is a gas containing a gallium atom as a Group III element, and the dopant gas is a gas containing a magnesium atom.

13. The method for producing the Group III nitride semiconductor light-emitting device according to claim 1, wherein at least a nitrogen gas is supplied as a carrier gas and a molar ratio of nitrogen atom in the carrier gas is within a range of 30% to 80% in forming the p-type intermediate layer.

14. The method for producing the Group III nitride semiconductor light-emitting device according to claim 1, wherein the flow rate of the dopant gas is increased in a step function near the start of the second period.

15. The method for producing the Group III nitride semiconductor light-emitting device according to claim 14, wherein the flow rate of the dopant gas increased in a step function is maintained in the second and third periods.

* * * * *